(12) United States Patent
Matsui et al.

(10) Patent No.: US 6,975,003 B2
(45) Date of Patent: Dec. 13, 2005

(54) SEMICONDUCTOR CMOS SOI (75) Inventors: Osamu Matsui, Kyoto (JP); Yoshinobu Sato, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 129 days.

(21) Appl. No.: 10/690,705

(22) Filed: Oct. 23, 2003

(65) Prior Publication Data
US 2004/0079998 A1 Apr. 29, 2004

(30) Foreign Application Priority Data
Oct. 24, 2002 (JP) ............... 2002-309319

(51) Int. Cl.[7] .......................... H01L 27/092
(52) U.S. Cl. ............ 257/351; 257/338; 257/350
(58) Field of Search .................. 257/335, 337, 257/338, 350, 351

(56) References Cited

U.S. PATENT DOCUMENTS 5,929,493 A * 7/1999 Wu .................. 257/369
6,313,508 B1 11/2001 Kobayashi

* cited by examiner

Primary Examiner—Gene M. Munson
(74) Attorney, Agent, or Firm—McDermott Will & Emery LLP (57) ABSTRACT

An N-channel transistor includes: an N-type source region, a gate electrode, a P-type body region, an N-type drain offset region, and a drain contact region, which is an N-type drain region. The transistor further includes a gate insulating film that has a thin oxide silicon film (a thin film portion) and a LOCOS film (a thick film portion). The body region has an impurity profile in which the concentration reaches a maximum value near the surface and decreases with distance from the surface. The drain offset region has an impurity profile that has an impurity-concentration peak in a deep portion located a certain depth-extent below the lower face of the LOCOS film.

11 Claims, 7 Drawing Sheets

SEMICONDUCTOR CMOS SOI

BACKGROUND OF THE INVENTION

The present invention relates to a semiconductor device and a method for fabricating the device, and more particularly relates to a semiconductor device in which MOS transistors are formed on an SOI (silicon on insulator) substrate, and a method for fabricating the device.

Conventionally, semiconductor devices that have a MOS structure, in which a Pch-transistor and an Nch-transistor are formed on an SOI substrate, have found a wide variety of applications. Particularly, the patent document 1 (Japanese Laid-Open Patent Publication No. 3111947 (FIG. 1 and descriptions thereof)) discloses a semiconductor device for use in a driving circuit in a plasma display, which semiconductor device employs MOS transistors with an offset structure in order to obtain a high breakdown-voltage characteristic.

Figure 6:
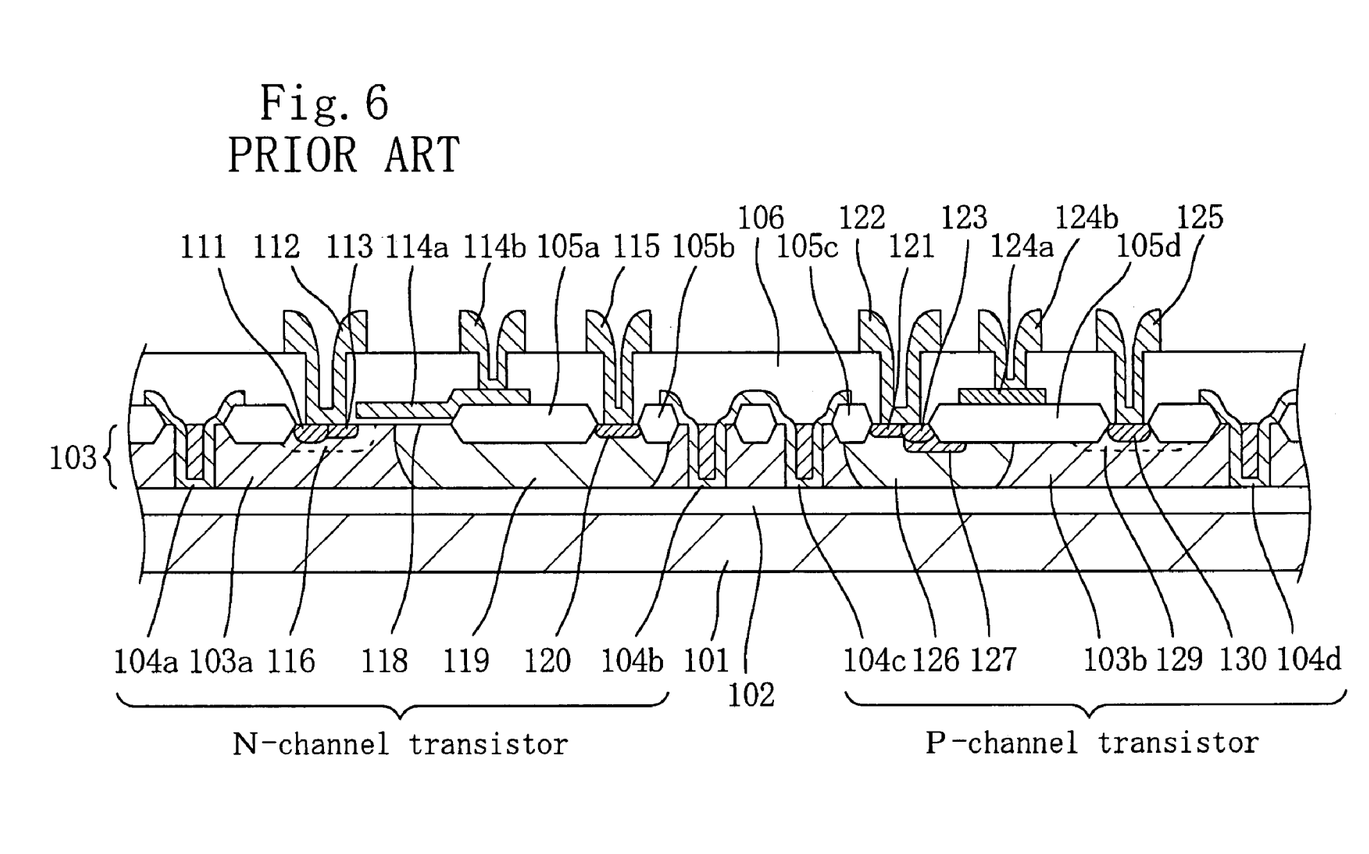
FIG. 6 is a cross-sectional view of a conventional semiconductor device that includes transistors with an offset structure as the semiconductor device disclosed in the patent document 1 does.

FIG. 6 is a cross-sectional view of a conventional semiconductor device that includes transistors with an offset structure as the semiconductor device disclosed in the patent document 1 does. In the semiconductor device shown in FIG. 6, an N-channel transistor and a P-channel transistor, each being a MOS transistor with an offset structure, are formed on a common SOI substrate.

As shown in FIG. 6, the conventional semiconductor device includes a buried oxide film 102, a semiconductor layer 103, trench isolation regions 104, field oxide films 105a through 105d, and an interlevel dielectric film 106. The buried oxide film 102 is formed on a supporting substrate (silicon substrate) 101. The semiconductor layer 103 is formed on the buried oxide film 102. The trench isolation regions 104 are provided to divide the semiconductor layer 103 into a plurality of active regions 103a, 103b, . . . . The field oxide films 105a through 105d are formed by a LOCOS technique. The interlevel dielectric film 106 covers the semiconductor layer 103.

The SOI substrate in the conventional semiconductor device is formed by polishing one of the two silicon substrates, each containing a low concentration of a P-type impurity, that are connected with each other via the buried oxide film 102 until the polished substrate becomes thin.

An N-channel transistor is formed in the first active region 103a. The N-channel transistor includes a back-gate contact region 111, a source electrode 112, a source region 113, a gate electrode 114a, an extraction gate electrode 114b, a drain electrode 115, a body region 116, a gate oxide film 118, a drain offset region 119, and a drain contact region 120. The back-gate contact region 111 contains a P-type impurity at a high concentration. The source electrode 112 is made of metal. The source region 113 contains an N-type impurity at a high concentration. The gate electrode 114a is made of polysilicon, and the extraction gate electrode 114b is made of metal. The drain electrode 115 is made of metal. The body region 116 contains a P-type impurity at a low concentration. The gate oxide film 118 is made of a thin silicon oxide film. The drain offset region 119 contains an N-type impurity at a low concentration. The drain contact region 120 contains an N-type impurity at a high concentration. In the N-channel transistor, the gate electrode 114a extends not only over the gate oxide film 118 but also over the field oxide film 105a. In other words, a part of the field oxide film 105a functions as a gate insulating film.

The N-channel transistor is formed in the first active region 103a, which is formed by surrounding with the trench isolation regions 104 a given region in the low-concentration-P-type-impurity-containing semiconductor layer 103 formed on the buried oxide film 102 on the supporting substrate 101, so that the first active region 103a is isolated from the peripheral devices by the insulators.

The body region 116 is formed shallowly by implanting ions of a P-type impurity (boron, for example) to a medium concentration into a surface region of the first active region 103a. The body region 116 has an impurity concentration profile in which the concentration shows a maximum value near the surface and decreases with distance from the surface. The high-concentration-N-type-impurity-containing source region 113, which is formed in a surface region within the body region 116, is electrically connected with the body region 116. In order to make the electrical connection be in good condition, the high-concentration-P-type-impurity-containing back-gate contact region 111 is provided, and the source region 113 is electrically connected to the body region 116 via the source electrode 112.

The drain offset region 119 is an N-well, which is formed by implanting ions of phosphorous as an N-type impurity into the first active region 103a. The drain offset region 119 has an impurity concentration profile in which the concentration shows a maximum value near the surface and decreases with distance from the surface. The drain offset region 119 is formed slightly spaced apart from the body region 116 within the first active region 103a. The drain contact region 120 is formed by implanting ions of an N-type impurity (arsenic) to a high concentration into a surface region within the drain offset region 119. The drain contact region 120 is in contact with the drain electrode 115.

The field oxide film 105a is formed on the first active region 103a between the source region 113 and the drain contact region 120, so as to be located closer to the drain contact region 120. The gate oxide film 118 is formed on the first active region 103a between the source region 113 and the drain contact region 120, so as to be located closer to the source region 113. The gate electrode 114a is formed extending over the gate oxide film 118 as well as over a part of the field oxide film 105a. The gate electrode 114a is formed to be connected to an end portion of the field oxide film 105a, and also serves as a kind of field plate, so that electric field concentration will not be apt to occur in the vicinity of the source region 113.

Further, a P-channel transistor is formed in the second active region 103b. The P-channel transistor includes a back-gate contact region 121, a source electrode 122, a source region 123, a gate electrode 124a, an extraction gate electrode 124b, a drain electrode 125, a body region 126, a field oxide film 105d, a drain offset region 129, and a drain contact region 130. The back-gate contact region 121 contains an N-type impurity at a high concentration. The source electrode 122 is made of metal. The source region 123 contains a P-type impurity at a high concentration. The gate electrode 124a is made of polysilicon, and the extraction gate electrode 124b is made of metal. The drain electrode 125 is made of metal. The body region 126 contains an N-type impurity at a low concentration. The field oxide film 105d acts as a gate insulating film. The drain offset region 129 contains a P-type impurity at a low concentration. The drain contact region 130 contains a P-type impurity at a high concentration. In the P-channel transistor, a gate oxide film of a thin silicon oxide such as shown in the N-channel transistor is not formed, and the entire gate electrode 124a is provided on the field oxide film 105d.

The P-channel transistor is formed in the second active region 103b, which is formed by surrounding with the trench isolation regions 104 a given region in the low-concentration-P-type-impurity-containing semiconductor layer 103 formed on the buried oxide film 102 on the supporting substrate 101 so that the second active region 103b is isolated from the peripheral devices by the insulators.

The drain offset region 129 is a P-well, which is formed by implanting ions of boron as a P-type impurity into the second active region 103b. The drain offset region 129 has an impurity concentration profile in which the concentration shows a maximum value near the surface and decreases with distance from the surface. The drain contact region 130 is formed by implanting ions of a P-type impurity (boron) to a high concentration into a surface region within the drain offset region 129. The drain contact region 130 is in contact with the drain electrode 125.

SUMMARY OF THE INVENTION

In the above-described conventional semiconductor device, the distance in which the drain offset region 119 extends (that is, the distance from the drain contact region 120 to the drain offset region 119 end portion located directly under the gate electrode 114a) is increased in the N-channel transistor, so that the N-channel transistor has an increased drain-to-source breakdown voltage, which leads to a good breakdown-voltage characteristic. However, in this case there is a limit in current driving capability. Nevertheless, N-channel transistors such as output transistors used in ICs for PDPs (plasma display panels) often need not only high breakdown-voltage characteristics but also current driving capability.

In view of this, if the distance in which the drain offset region 119 extends is reduced in order to decrease the on-resistance and thereby obtain sufficient current driving capability, a tradeoff in which a sufficient breakdown voltage characteristic cannot be obtained occurs.

Another way to reduce the on-resistance of the N-channel transistor might be to increase the distance in the transverse direction that intersects perpendicularly to the extending direction. However, in this case, the device would increase in size (the area in the plane direction) so that parasitic capacitance between the supporting substrate 101 and the first active region 103a would increase, resulting in the problem of deterioration in the switching characteristic of the transistor.

According to simulations and experiments that the present inventors carried out, it was found that the above-described problem arose particularly noticeably when the thickness of the practically used semiconductor layer with a thickness of 5–6 $\mu$m was reduced to decrease the parasitic capacitances of the first and second active regions 103a and 103b so as to speed up the switching operation of the semiconductor device.

On the other hand, a P-channel transistor, which is used in a circuit for pre-driving its output transistor, does not need much current driving capability but needs a high breakdown-voltage characteristic. And, a P-channel transistor needs not only a high drain-to-source breakdown voltage but also a high gate breakdown voltage that is obtainable by employing a thick filed oxide film as a gate insulating film. Nevertheless, also in this case, a problem in which large current driving capability cannot be obtained occurs.

According to investigation performed by the present investors, the above-mentioned problem arises presumably due to the following reasons: If the field oxide film 105a is formed after the formation of the drain offset region 119, a portion having a high impurity concentration is absorbed into the field oxide film 105a, so that only a low impurity-concentration portion of the drain offset region 119 is left directly under the field oxide film 105a, which increases the on-resistance of the transistor.

It is therefore an object of the present invention to provide, based on the above-described investigation of the causes, a semiconductor device that has a small on-resistance and a high breakdown voltage characteristic, and a method for fabricating the device.

In a first inventive semiconductor device, which is a semiconductor device formed by using a so-called SOI substrate, a first transistor, provided in a first active region of a semiconductor layer above a buried insulating film and having a channel of a first conductivity type, includes a first drain offset region of the first conductivity type that has an impurity-concentration peak in a deep portion located a certain depth-extent below the lower face of a thick film portion of a gate insulating film, which thick film portion is formed closer to the drain by a LOCOS technique.

With this structure, the portion of the first drain offset region that contains the first-conductivity-type impurity at a high concentration is allowed to remain without being absorbed into the LOCOS film, which permits the on-resistance of the first transistor to be kept as small as possible.

In this case, the deep portion of the first drain offset region may be to an extent at which the on-resistance of the first transistor is equal to or less than a first established value. For example, when the thickness of the semiconductor layer beneath the thick film portion is 3.2 $\mu$m, it is preferable that the deep portion be an extent of 0.4 through 1.5 $\mu$m in depth from the lower face of the thick film portion (generally, an extent of 10% through 60% into the thickness of the semiconductor layer beneath the thick film portion) and it is more preferable that the deep portion be an extent of 0.6 through 1.8 $\mu$m in depth from the lower face of the thick film portion (that is, an extent of 20% through 40% into the semiconductor-layer thickness beneath the thick film portion.)

Further, the deep portion of the first drain offset region is also preferably to an extent at which the source-to-drain breakdown voltage of the first transistor is equal to or greater than a second established value. For example, when the semiconductor-layer thickness beneath the thick film portion is 3.2 $\mu$m, it is preferable that the deep portion of the first drain offset region be an extent of 0.8 through 1.8 $\mu$m in depth from the lower face of the thick film portion (generally, an extent of 25% through 60% into the semiconductor-layer thickness beneath the thick film portion.)

Moreover, when a second transistor includes a second body region of the first conductivity type that is located closer to the source and has an impurity-concentration peak in a deep portion located a certain depth-extent below the lower face of a second gate insulating film, the source-to-drain breakdown voltage of the second transistor increases.

In a second inventive semiconductor device, which is a semiconductor device formed by using a so-called SOI substrate, a second transistor, provided in a second active region of a semiconductor layer above a buried insulating film and having a channel of a second conductivity type, includes a second body region of a first conductivity type that is located closer to the source and has an impurity-concentration peak in a deep portion located a certain depth-extent below the lower face of a second gate insulating film formed by a LOCOS method.

Then, the source-to-drain breakdown voltage of the second transistor increases.

An inventive semiconductor-device fabrication method is a method for fabricating a semiconductor device that is formed by using a so-called SOI substrate. In the inventive method, ions of an impurity of a first conductivity type are implanted at a high energy into a region in which a first drain offset region is to be formed, and thereafter a first body region and the first drain offset region are formed by heat treatment in such a manner that the first body region has a second-conductivity-type-impurity concentration peak in a surface region of a semiconductor layer, while the first drain offset region has a first-conductivity-type-impurity concentration peak in a deep portion located a certain depth-extent below the lower face of a thick film portion of a first gate insulating film that is to be formed later.

By this method, the structure of the first inventive semiconductor device is obtained.

The impurity-ion implantation into the first drain offset region is preferably performed so that the deep portion of the first drain offset region is to an extent at which the on-resistance of the first transistor is equal to or less than a first established value.

Further, when the ions of the first-conductivity-type-impurity are implanted into the region in which the first drain offset region in the first transistor is to be formed, if the first-conductivity-type-impurity ions are also implanted into a second body region of a second transistor, the second transistor having a high source-to-drain breakdown voltage is obtained in the simplified process steps.

DESCRIPTION OF THE PREFERRED EMBODIMENTS

Hereinafter, a semiconductor device and a method for fabricating the device in accordance with a best embodiment of the present invention will be described in detail with reference to the accompanying drawings. It should be noted however that the present invention is not limited to the following embodiment.

Figure 1:
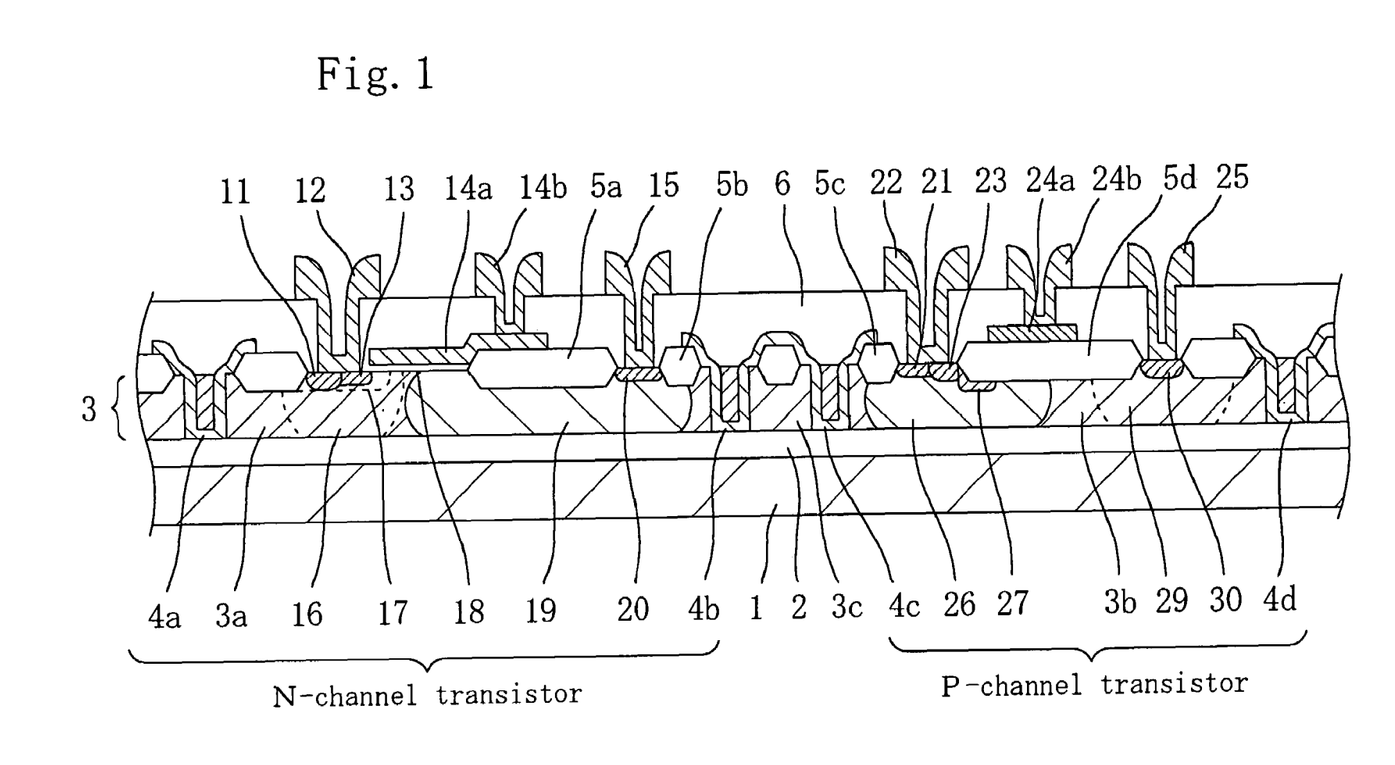
FIG. 1 is a cross-sectional view of a semiconductor device in accordance with an embodiment of the present invention.

FIG. 1 is a cross-sectional view of a semiconductor device in accordance with an embodiment of the present invention. As shown in FIG. 1, in the semiconductor device of this embodiment, N-channel and P-channel transistors, each being a MOS transistor having an offset structure, are formed on a common SOI substrate.

As shown in FIG. 1, the semiconductor device of this embodiment includes a buried oxide film 2, a semiconductor layer 3, trench isolation regions (device-isolating regions) 4, LOCOS films (thick film portions) 5a through 5d, and an interlevel dielectric film 6. The buried oxide film 2, having a thickness of about 1.5 $\mu$m, is formed on a supporting substrate (silicon substrate) 1. The semiconductor layer 3 is formed on the buried oxide film 2 and has a thickness of 3.5 $\mu$m (its thickness beneath the LOCOS film 5a is 3.2 $\mu$m). The trench isolation regions 4 are provided to divide the semiconductor layer 3 into a plurality of active regions 3a, 3b, .... The LOCOS films 5a through 5d go about 0.3 $\mu$m into the semiconductor layer 3. The interlevel dielectric film 6 covers the semiconductor layer 3.

Structure of N-channel Transistor

In this embodiment, an N-channel transistor is formed in the first active region 3a. The N-channel transistor (a transistor of a first conductivity type) includes a back-gate contact region 11, a source electrode 12, a source region (a first source region) 13, a gate electrode (a first gate electrode) 14a, an extraction gate electrode 14b, a drain electrode 15, a body region (a first body region) 16, a Vt-control doped layer 17, a thin oxide silicon film (a thin film portion) 18, a drain offset region (a first drain offset region) 19, and a drain contact region (a first drain region) 20. The back-gate contact region 11 contains a P-type impurity at a high concentration. The source electrode 12 is made of metal. The source region 13 contains an N-type impurity at a high concentration. The gate electrode 14a is made of polysilicon, and the extraction gate electrode 14b is made of metal. The drain electrode 15 is made of metal. The body region 16 contains a P-type impurity at a low concentration. The Vt-control doped layer 17 contains a P-type impurity at a relatively high concentration. The thin oxide silicon film 18, which is formed by heat oxidation, has a thickness of about 10 nm. The drain offset region 19 contains an N-type impurity at a low concentration. The drain contact region 20 contains an N-type impurity at a high concentration. In the N-channel transistor, the gate electrode 14a extends not only over the thin oxide silicon film (thin film portion) 18 but also over the LOCOS film (thick film portion) 5a. In other words, a part of the LOCOS film 5a functions as a gate insulating film.

The N-channel transistor is formed within the first active region 3a that is formed by surrounding with the trench isolation regions 4 a given region in the semiconductor layer 3 that contains a low concentration of a P-type impurity and is formed on the buried oxide film 2 on the supporting substrate 1, so that the first active region 3a is isolated from the peripheral devices by the insulators.

The body region 16, which is formed deeply by implanting ions of a P-type impurity (boron) to a low concentration into the first active region 3a, has an impurity concentration profile in which the concentration shows a maximum value near the surface and decreases with distance from the surface. The source region 13, containing a high concentration of an N-type impurity (phosphorous or arsenic) and formed in a surface region within the body region 16, is electrically connected to the body region 16. In order to make the electrical connection be in good condition, the high-concentration-P-type-impurity-containing back-gate contact region 11 is provided, and the source region 13 is electrically connected to the body region 16 by the source electrode 12.

The drain offset region 19 is a special N-well, which is formed by implanting ions of phosphorous as an N-type impurity at a high energy into the first active region 3a, and then performing a diffusion process by heating. The drain offset region 19 is formed adjacent to the body region 16 in the first active region 3a. Further, the drain offset region 19 has an impurity concentration profile that has an impurity-concentration peak in a deep portion located a certain depth-extent below the lower face of the LOCOS film 5a (for example, a region in which the on-resistance of the N-channel transistor is set equal to or lower than a first established value, or a region whose distance from the lower face of the LOCOS film 5a is from 0.4 to 1.5 $\mu$m), and in which the concentration decreases heading toward the upper and bottom faces from the impurity concentration peak. This embodiment is characterized by this feature.

The drain contact region 20, which is formed by implanting ions of an N-type impurity (arsenic) to a high concentration into a surface region within the drain offset region 19, is in contact with the drain electrode 15.

The LOCOS film 5a is formed on the first active region 3a between the source region 13 and the drain contact region 20, so as to be located closer to the drain contact region 20 (that is, closer to the drain). The dimension of the LOCOS film 5a in the transverse direction in the cross section shown in FIG. 1 is 8 to 18 $\mu$m (10 $\mu$m, for example). The thin oxide silicon film 18 is formed on the first active region 3a between the source region 13 and the drain contact region 20, so as to be located closer to the source region 13 (that is, closer to the source). The dimension of the thin oxide silicon film 18 in the transverse direction in the cross section shown in FIG. 1 is about 4 $\mu$m. The gate electrode 14a is formed extending over the thin oxide silicon film 18 as well as over a part of the LOCOS film 5a. The gate electrode 14a is formed to be connected to an end portion of the LOCOS film 5a, and also serves as a kind of field plate so that electric field concentration will not be apt to occur in the vicinity of the source region 13.

The Vt-control doped layer 17, containing a relatively high concentration of a P-type impurity and formed in the body region 16 so as to overlap with the source region 13, is provided in order to set the threshold voltage Vt of the N-channel transistor at an optimum value, and is not necessarily needed.

When the N-channel transistor in the semiconductor device of this embodiment operates in its on-state, current flows mainly in the high concentration region in the drain offset region 19. As described above, in the drain offset region 19, the impurity concentration peak is located in the deep portion of the semiconductor layer 3 in the thickness direction, so that the impurity contained in the drain offset region 19 is hardly absorbed into the LOCOS film 5a. In other words, it is possible to efficiently suppress a decrease in the impurity concentration in the high concentration region in the drain offset region 19 when the LOCOS film 5a is formed, thereby enabling the on-resistance of the transistor to be reduced.

In contrast, in the drain offset region 119 in the N-channel transistor in the conventional semiconductor device, the impurity concentration peak is located near the surface of the semiconductor layer 3 in the thickness direction, which allows most of the impurity contained in the drain offset region 119 to be absorbed into the LOCOS film 105a when the LOCOS film 105a is formed. Presumably, as a result not many low-resistance areas were left in the drain offset region 119.

Further, in the N-channel transistor in the semiconductor device of this embodiment, the peak of the impurity concentration in the P-type-impurity-containing body region 16 is located near the surface region, while the impurity concentration peak in the N-type-impurity-containing drain offset region 19 is located in the deep portion of the semiconductor layer 3 in the thickness direction. This averts counteraction of the impurities that is due to the impurity concentration peaks being close to each other. Moreover, the drain offset region 19 and the body region 16 are both wells in which the impurity concentration is low as a whole. Thus, even if these regions are provided adjacent to each other, the gradient of concentration (impurity-concentration variation per unit distance) in the region extending from the drain offset region 19 to the body region 16 is allowed to be small, so that local electric filed concentration is avoided, thereby enabling the source-to-drain breakdown voltage to increase.

Accordingly, the N-channel transistor of this embodiment, which has a low gate breakdown voltage due to the small thickness of the thin oxide silicon film 18, achieves transistor characteristics in which the drain-to-source breakdown voltage is high, while the on-resistance is small. In addition, in a case where a transistor that has the same current driving capability as that of a conventional transistor is sufficient, the plan configuration of the transistor can be reduced, in which case it is also possible to reduce the parasitic capacitance inherent in the transistor and thereby enhance the speed of the switching operation of the transistor.

P-channel Transistor

A P-channel transistor is formed in the second active region 3b. The P-channel transistor (a transistor of a second conductivity type) includes a back-gate contact region 21, a source electrode 22, a source region 23 (a second source region), a gate electrode (a second gate electrode) 24a, an extraction gate electrode 24b, a drain electrode 25, a body region (a second body region) 26, an intermediate source region (a third source region) 27, a LOCOS film 5d, a drain offset region (a second drain offset region) 29, and a drain contact region 30. The back-gate contact region 21 contains an N-type impurity at a high concentration. The source electrode 22 is made of metal. The source region 23 contains a P-type impurity at a high concentration. The gate electrode 24a is made of polysilicon, and the extraction gate electrode 24b is made of metal. The drain electrode 25 is made of metal. The body region 26 contains an N-type impurity at a low concentration. The intermediate source region 27 contains a P-type impurity at a high concentration. The LOCOS film 5d functions as a gate insulating film. The drain offset region 29 contains a P-type impurity at a low concentration. The drain contact region 30 contains a P-type impurity at a high concentration. In the P-channel transistor, a gate oxide film of a thin silicon oxide film such as shown in the N-channel transistor is not provided, and the entire gate electrode 24a is formed on the LOCOS film 5d.

The P-channel transistor is formed within the second active region 3b, which is formed by surrounding with the trench isolation regions 4 a given region in the low-concentration-P-type-impurity-containing semiconductor layer 3 formed on the buried oxide film 2 on the supporting substrate 1 so that the second active region 3b is isolated from the peripheral devices by the insulators.

The low-concentration-P-type-impurity-containing drain offset region 29 is a P-well, which is deeply formed extending from the surface of the semiconductor layer 3 to the vicinity of the buried oxide film 2, by implanting ions of boron as a P-type impurity into the second active region 3b, and then performing a diffusion process by heating. The drain offset region 29 has an impurity concentration profile in which the impurity concentration reaches its peak near the surface, and decreases with distance from the surface. Therefore, it is possible to form the drain offset region 29 simultaneously with the body region 16 of the N-channel transistor in the same diffusion process step.

The drain contact region 30, which is formed by implanting ions of an P-type impurity (boron) to a high concentration into a surface region within the drain offset region 29, is in contact with the drain electrode 25.

The low-concentration-N-type-impurity-containing body region 26 is a special N-well, which is formed by implanting ions of phosphorous at a high energy into the second active region 3b, and then performing a diffusion process by heating. The body region 26 has an impurity concentration profile that has an impurity-concentration peak in a deep portion in the semiconductor layer 3 in the thickness direction (for example, a region in which the source-to-drain breakdown voltage of the P-channel transistor is set equal to or greater than a third established value, or a region whose distance from the lower face of the thick film portion is from 0.8 to 1.3 $\mu$m), and in which the concentration decreases heading toward the upper and bottom faces from the impurity concentration peak. This embodiment is characterized by this feature.

Further, the body region 26 is formed spaced apart from the drain offset region 29 in the second active region 3b. In surface regions within the body region 26, the high-concentration-N-type-impurity-containing back-gate contact region 21 and the high-concentration-P-type-impurity-containing source region 23 are formed, and these regions are connected to the source electrode 22.

Moreover, the intermediate source region 27 is formed in a surface region in the body region 26 that is connected to the source region 23 and located directly under the end-portion of the LOCOS film 5d alongside the source. It should be noted that the intermediate source region 27 and the source region 23 are formed in different diffusion process steps. In a case where a low breakdown-voltage CMOS device (not shown) whose descriptions are omitted herein is also formed on the same SOI substrate, the intermediate source region 27 may be formed in the same diffusion process step as a channel stopper (not shown) formed directly under a LOCOS film (not shown) used in the low breakdown-voltage CMOS device is formed.

The LOCOS film 5d is formed on the second active region 3b between the source region 23 and the drain contact region 30 in such a manner that the LOCOS film 5d extends from a part of the drain offset region 29 to a region located between the intermediate source region 27 in the body region 26 and the drain offset region 29. The gate electrode 24a is formed on the LOCOS film 5d, and the LOCOS film 5d also serves as a gate insulating film in the P-channel transistor. Since the LOCOS film 5d has a thickness of greater than 300 nm, which is far greater than that of a normal transistor gate oxide film, the gate breakdown voltage is extremely high.

The P-channel transistor in the semiconductor device of this embodiment has an extremely high gate breakdown voltage, owing to the large thickness of the LOCOS film 5d located directly under the gate electrode 24a.

Further, in the P-channel transistor in the semiconductor device of this embodiment, the impurity concentration peak in the P-type-impurity-containing drain offset region 29 is located in the surface region, while the impurity concentration peak in the N-type-impurity-containing body region 26 is located in the deep portion of the semiconductor layer 3 in the thickness direction. This therefore averts counteraction of the impurities that is duet to these impurity concentration peaks being close to each other. Accordingly, the gradient of concentration (impurity-concentration variation per unit distance) in the region located from the body region 26 to the drain offset region 29 is allowed to be small, so that local electric filed concentration is avoided, thereby enabling the source-to-drain breakdown voltage to increase.

Moreover, the diffusion process step for the N-channel transistor having a small on-resistance and a high breakdown voltage, and the diffusion process step for the P-channel transistor may be performed in the same process step, so that the two kinds of transistors, that is, the N-channel and P-channel transistors, can be integrated on a single SOI substrate at low costs.

It should be noted that in a case where the N-channel and P-channel transistors are formed on the same SOI substrate, the structure of the trench isolation regions 4 is preferably varied depending on whether a low breakdown voltage or a high breakdown voltage is required. For example, if a low breakdown voltage equal to or less than 50 V is required, providing a single trench isolation region 4 between the N-channel and P-channel transistors allows electrical isolation to be kept therebetween. If a high breakdown voltage of from 80 to 200 V is required, on the other hand, an isolation region 3c is formed between two trench isolation regions 4b and 4c, and an intermediate potential between maximum and minimum potentials that are applied to the N-channel and P-channel transistors is applied to the isolation region 3c, whereby electrical isolation is maintained even when circuit operation is performed at a high voltage.

Semiconductor Device Fabrication Process

Next, a method for fabricating a semiconductor device of this embodiment that has the structure shown in FIG. 1 will be described in detail with reference to the accompanying figures. FIGS. 2(a) through 2(d), FIGS. 3(a) through 3(c) and FIGS. 4(a) and 4(b) are cross-sectional views illustrating process steps for fabricating the semiconductor device of this embodiment.

Figure 2A:
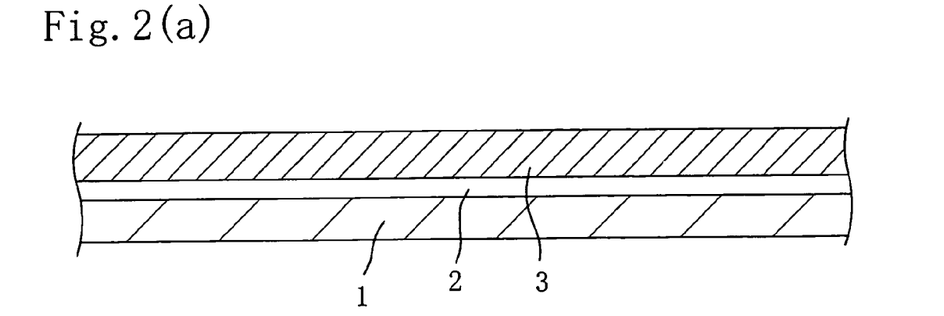
FIGS. 2(a) through 2(d) are cross-sectional views illustrating, among the process steps for fabricating the semiconductor device of the embodiment of the present invention, process steps for forming a body region and a drain offset region, for example.

First, in the step shown in FIG. 2(a), a buried oxide film 2 with a thickness of 1.5 $\mu$m is formed by a heat oxidation process on a supporting substrate 1, which is a silicon substrate containing a P-type impurity, the buried oxide film 2 is joined to another silicon substrate that contains a low concentration of a P-type impurity, and the another silicon substrate is then polished, whereby an SOI substrate is prepared. The SOI substrate includes the supporting substrate 1, the buried oxide film 2 with a thickness of 1.5 $\mu$m formed on the supporting substrate 1, and the semiconductor layer 3 with a thickness of 3.5 $\mu$m formed on the buried oxide film 2.

Figure 2B:
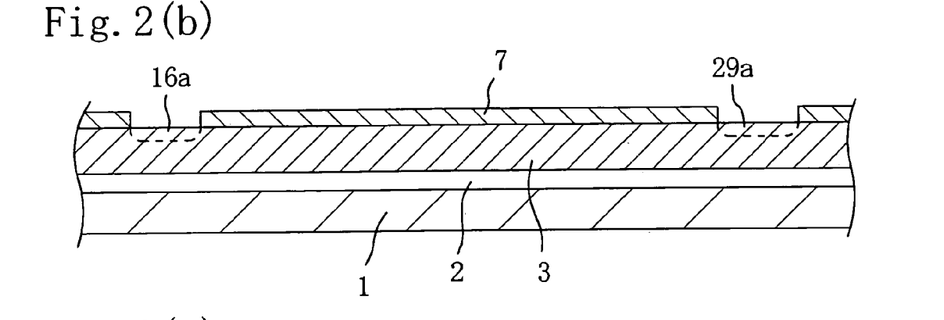

Next, in the process step shown in FIG. 2(b), a resist film 7 having a thickness of about 1 $\mu$m is formed on the upper surface of the semiconductor layer 3. This is followed by a process step for forming openings in a first given portion (which is located on a region in which a body region of an N-channel transistor is to be formed) and a second given portion (which is located on a region in which a drain offset region of a P-channel transistor is to be formed) in the resist film 7. Then, with the resist film 7 used as a mask, ions of boron ($B^+$) as a P-type impurity are implanted into the semiconductor layer 3 at a routine-level acceleration voltage, which is an acceleration voltage of from 50 to 200 keV, at a dose of $2\times10^{12}$ cm$^{-2}$. In the ion-implantation performed at such a routine-level acceleration voltage, the acceleration energy at which the ions are introduced is small so that the implanted boron is present in impurity-implanted regions 16a and 29a, which are regions at a very shallow depth from the semiconductor layer 3 surface. At this stage, the regions are not activated to serve as doped layers. After the ion implantation has been completed, the resist film 7 used as the mask is removed by etching.

Subsequently, in the process step shown in FIG. 2(c), a thick resist film 8 is formed on the upper surface of the semiconductor layer 3. The resist film 8 has a thickness of from 2 to 3.5 μm. This is followed by a process step for forming openings in a third given portion (which is located on a region in which a drain offset region of the N-channel transistor is to be formed) and a fourth given portion (which is located on a region in which a body region of the P-channel transistor is to be formed) in the resist film 8. Thereafter, with the resist film 8 used as a mask, ions of phosphorous as an N-type impurity are implanted into a portion of the semiconductor layer 3 which is located from a near-surface portion thereof to an inner portion thereof, at a high acceleration voltage such as an acceleration voltage of from 500 keV to 2 MeV at a dose of from $1\times10^{12}$ cm$^{-2}$ to $5\times10^{12}$ cm$^{-2}$. The ion implantation performed at such a high acceleration voltage is herein referred to as a "high-energy implantation". As a result of the high-energy implantation, the phosphorous is introduced into a region whose depth from the upper surface of the semiconductor layer 3 is 0.7 to 1.8 μm. In other words, impurity-implanted regions 19a and 26a are formed in the deep portions of the semiconductor layer 3 in the depth direction. At this stage, these impurity-implanted regions 19a and 26a are not activated to act as doped layers. After the ion implantation has been completed, the resist film 8 is removed by etching.

Hereinafter, the high-energy implantation will be discussed in detail. The depth to which impurity ions are implanted varies depending on the acceleration voltage, and when the acceleration voltage is high, the implanted impurities go deeply in through the surface. By ion implantation, impurities are introduced to substantially the same depth through the underlying layer surface, irrespective of the material of the underlying layer. Therefore, in a case of performing a high-energy implantation, in which impurities are introduced to a deep depth through the surface, it is necessary to cover, with a thick resist film, regions into which the impurities should not be introduced. Thus, if the acceleration voltage is increased, the resist film has to be formed thick depending on the magnitude of the acceleration voltage. In order to increase the thickness of the resist film, the viscosity of the undiluted solution for the resist film may be increased, or the undiluted solution for the resist film may be applied multiple times.

Figure 2C:
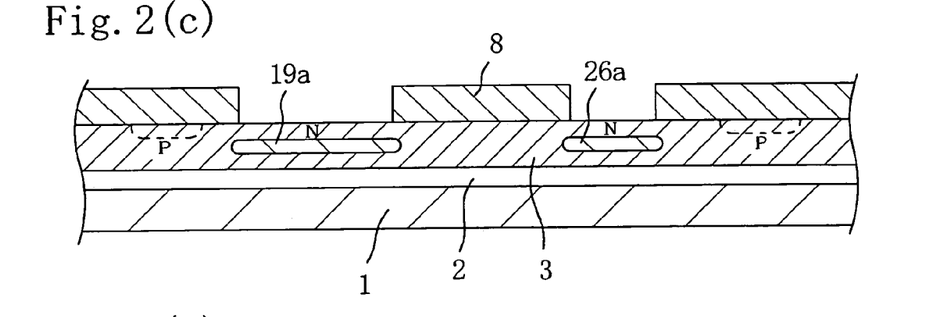
Figure 2D:
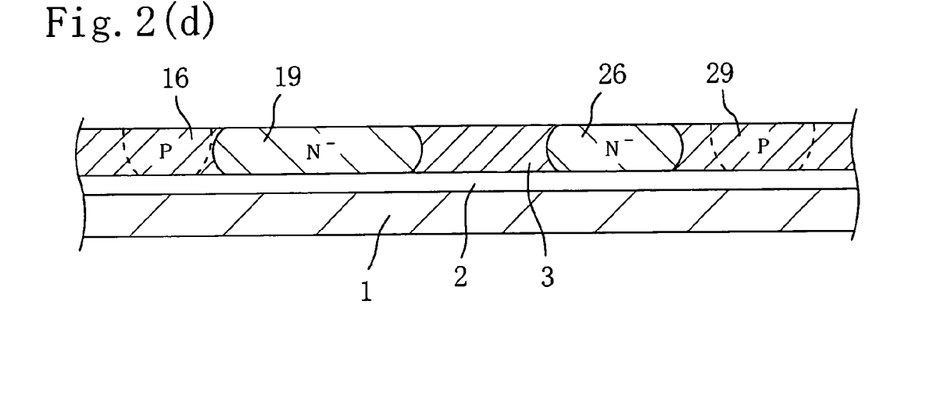

Next, in the process step shown in FIG. 2(d), a diffusion treatment is performed by heating the SOI substrate at a high temperature of from 1100 to 1200° C. for 120 to 180 minutes. In this process step, the impurities are diffused in the semiconductor layer, such that the impurities in their inactive state are activated to form the body region 16 and the drain offset region 29, which are P-wells, and the body region 26 and the drain offset region 19, which are N-wells.

The above-described body region 16 and drain offset region 29 each has an impurity profile in which the impurity concentration reaches its peak near the surface of the semiconductor layer 3 and decreases with distance from the surface. On the other hand, the body region 26 and the drain offset region 19 show impurity profiles in which the respective impurity concentration peaks exist in respective center portions of the implantation regions 26a and 19a, that is, the deep portions of the semiconductor layer 3 in the thickness direction, and the respective impurity concentrations decrease heading toward the surface and bottom faces of the semiconductor layer 3. In this embodiment, the deep portion is defined as a region which is an extent of 0.4 through 1.5 μm from the lower face of the LOCOS film 5a. How deep the impurities are introduced into the semiconductor layer 3 by the high-energy implantation may be set by the level of the acceleration voltage in the ion implantation.

Figure 3A:
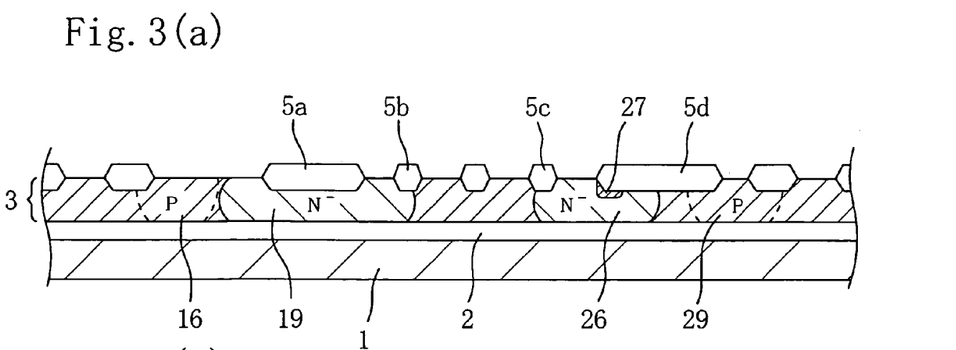
FIGS. 3(a) through 3(c) are cross-sectional views illustrating, among the process steps for fabricating the semiconductor device of the embodiment of the present invention, process steps for forming a gate insulating film, a gate electrode, and a source/drain region, for example.

Then, in the process step shown in FIG. 3(a), after a not-shown resist film having an opening for exposing a region, in which an intermediate source region is to be formed, is formed on the semiconductor layer 3, ions of boron as a P-type impurity are implanted. After the ion implantation process has been completed, the not-shown resist film is removed. Thereafter, a heat treatment is performed to activate the implanted impurity, thereby forming a heavily doped P-type intermediate source region 27.

Subsequently, a nitride film (not shown) having openings for exposing regions in the semiconductor layer 3, in which LOCOS films 5a, 5b, 5c, 5d, . . . are to be formed, is formed. Then, the SOI substrate is heat-treated with steam being introduced, to form the LOCOS films 5a, 5b, 5c, 5d, . . . in the openings in the nitride film (not shown). In this process step, as the oxidation of silicon proceeds to increase the thickness of the LOCOS films 5a, 5b, 5c, 5d, . . . , silicon in the semiconductor layer 3 is absorbed into the silicon oxide films. When the nitride film (not shown) is removed after the LOCOS films 5a, 5b, 5c, 5d, . . . have been formed, the LOCOS films 5a, 5b, 5c, 5d, . . . with tapered end portions, which are so-called bird's beaks, are obtained.

Figure 3B:
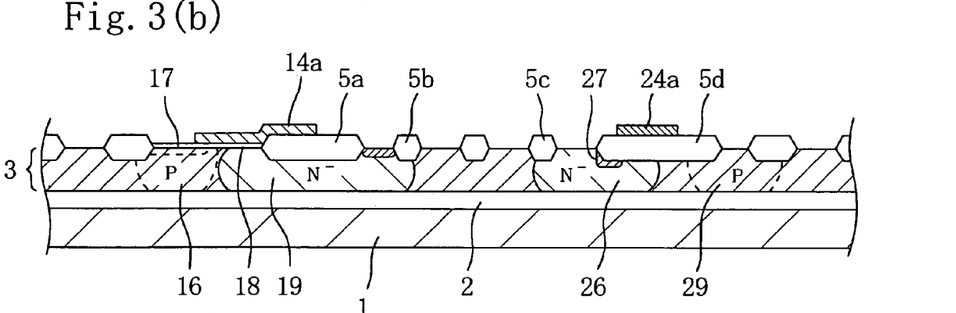

Next, in the process step shown in FIG. 3(b), a resist film (not shown) having an opening in a given portion is formed on the semiconductor layer 3 and on the LOCOS films 5a, 5b, 5c, 5d, . . . . Thereafter, ions of boron as a P-type impurity are implanted, thereby forming a Vt-control doped region 17 containing the P-type impurity at a relatively high concentration in a surface region of the body region 16. Then, a thin gate oxide film 18 having a thickness of about 10 nm is formed, after which silicon in an amorphous state is deposited on the thin gate oxide film 18 and a heat treatment is performed, thereby forming a polysilicon film. Thereafter, the polysilicon film is patterned to form gate electrodes 14a and 24a.

Figure 3C:
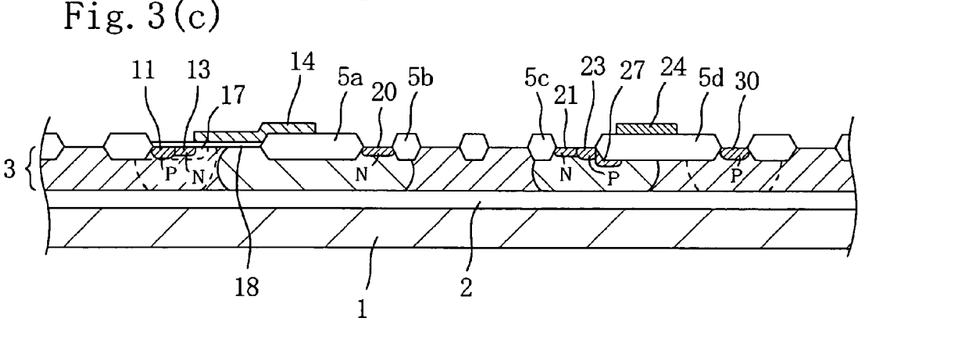

Subsequently, in the process step shown in FIG. 3(c), a resist film (not shown) having openings for exposing regions, into which impurity ions are to be implanted, is formed on the semiconductor layer 3. Thereafter, with the resist film used as a mask, ions of boron as a P-type impurity are implanted, thereby forming a back-gate contact region 11 containing the P-type impurity at a high concentration, a heavily doped P-type source region 23, and a heavily doped P-type drain contact region 30 at the same time. After the ion implantation has been completed, the resist film (not shown) is removed. By following similar procedures, with a resist film having openings in given portions, ions of arsenic as an N-type impurity are implanted, thereby forming a heavily doped N-type source region 13, a heavily doped N-type drain contact region 20 and a heavily doped N-type back-gate contact region 21 at the same time.

Figure 4A:
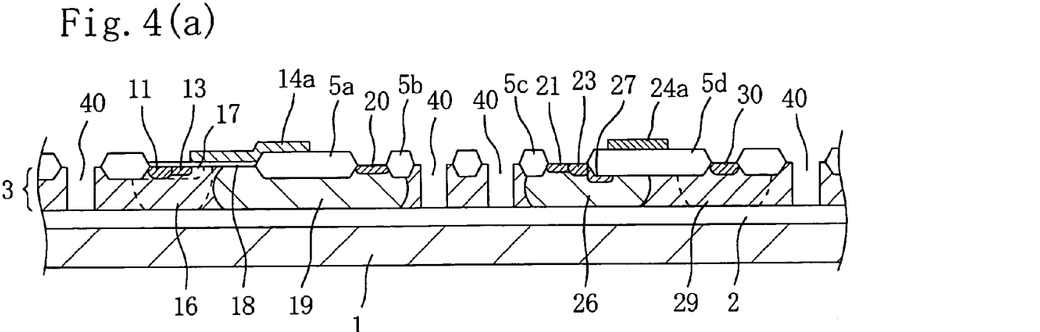
FIGS. 4(a) and 4(b) are cross-sectional views illustrating, among the process steps for fabricating the semiconductor device of the embodiment of the present invention, process steps for forming trench isolation regions, for example.

Subsequently, in the process step shown in FIG. 4(a), a resist film (not shown) having openings for exposing regions, in which trenches are to be formed, is formed on the substrate. Thereafter, with the resist film used as a mask, the semiconductor layer 3 is etched, thereby forming the trenches 40 that go through the semiconductor layer 3 to reach the buried oxide film 2.

Figure 4B:
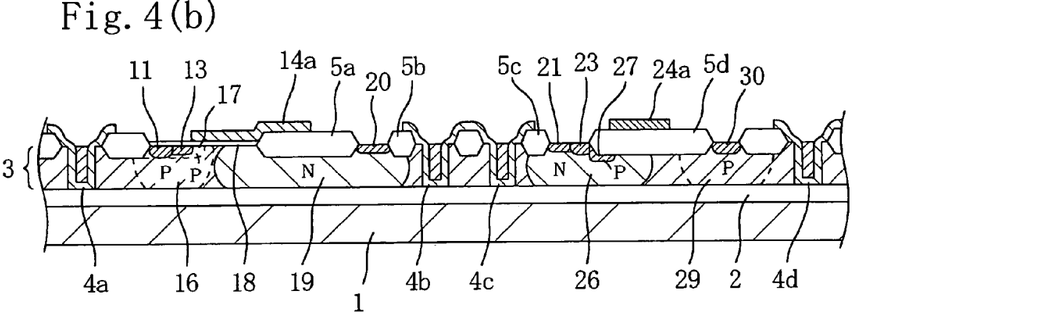

Subsequently, in the process step shown in FIG. 4(b), an oxide film is formed on the surface of the SOI substrate as well as on the trenches 40, and polysilicon is then deposited on the oxide film, thereby forming trench isolation regions 4a, 4b, 4c, 4d, each having the oxide film on the trench 40 surface, with a central portion of the trench 40 filled with the polysilicon.

In the following process steps, whose illustrations are omitted herein, an insulating film 6 is formed on the SOI substrate, contact holes are formed in the insulating film 6, metal films of copper and aluminum, for example, are deposited by vapor deposition, and the metal films are patterned. In this manner, source electrodes 12 and 22, gate electrodes 14b and 24b and drain electrodes 15 and 25 are formed. Through the above-described process steps, the structure of the semiconductor device of this embodiment shown in FIG. 1 is obtained.

In the above-described semiconductor-device fabrication method in accordance with this embodiment, the sequence of performing the ion implantation process step for the P-wells, and then the high-energy implantation process step for the N-wells may be reversed.

Effects of this Embodiment and Appropriate Ion-implantation Conditions

Figure 5:
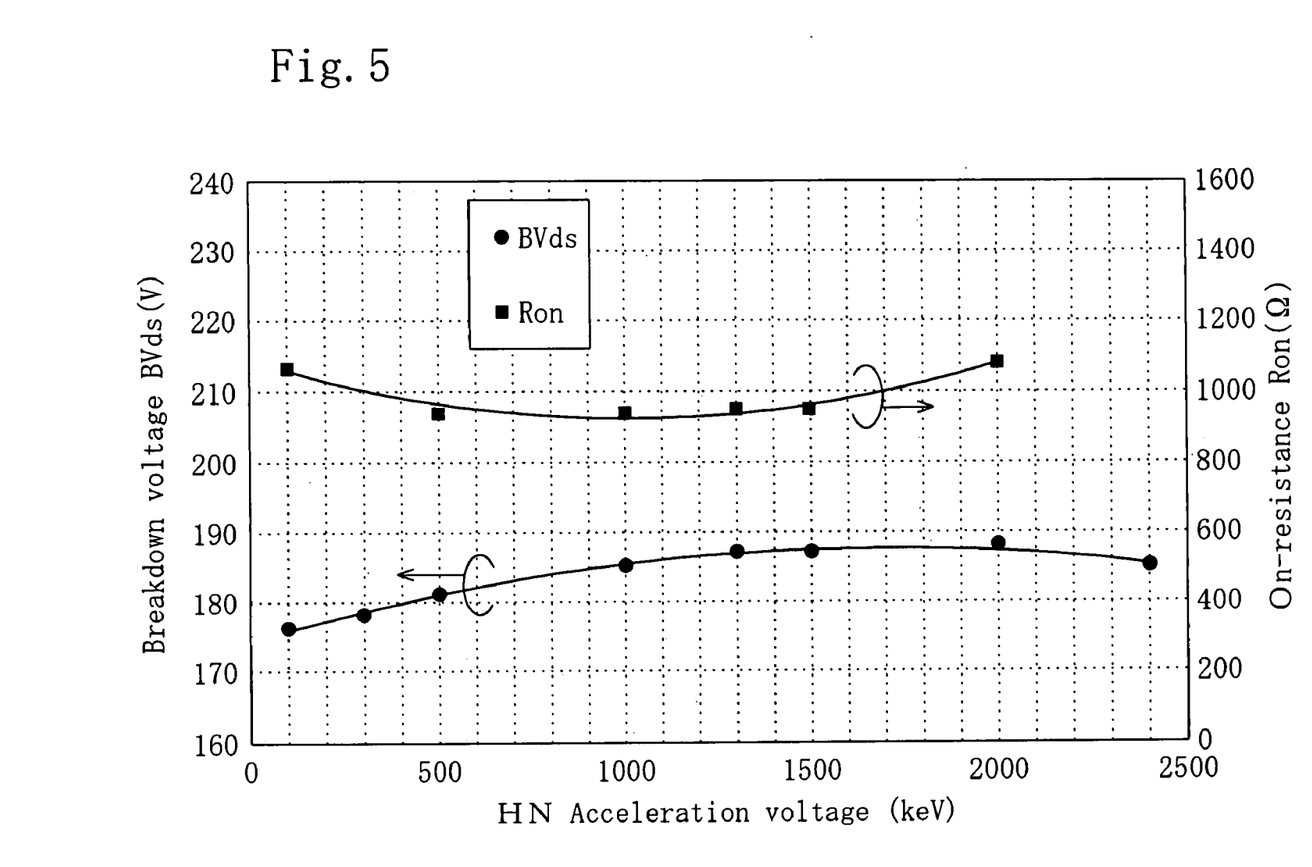
FIG. 5 is a view indicating simulation results on how the source-to-drain breakdown voltage and on-resistance of an N-channel transistor in the semiconductor device structure of this embodiment depend on ion-implantation acceleration energy.

FIG. 5 illustrates simulation results on how the source-to-drain breakdown voltage and on-resistance of the N-channel transistor in the semiconductor device structure of this embodiment depend on the ion-implantation acceleration energy. In FIG. 5, the abscissa represents the acceleration energy (acceleration voltage) in the phosphorous ion implantation (that is, the process step shown in FIG. 2(c)). The ordinate on the left-hand side of FIG. 5 indicates the source-to-drain breakdown voltage BVds (V) in the N-channel transistor, while the ordinate on the right-hand side represents the on-resistance Ron (Ω). The N-channel transistor used in the simulations of FIG. 5 has a structure shown in FIG. 1, in which the gate width is 1 μm and the length of the LOCOS film 5d in the gate length direction is 5 μm. Further, the dose is $2.5 \times 10^{12}$ cm$^{-2}$. Moreover, the LOCOS film 5a shown in FIG. 1 has a thickness of 0.6 μm when formed by heat oxidation (in the process step shown in FIG. 3(b)), and the extent to which the LOCOS film 5a goes into the semiconductor layer 3, that is, the depth of the lower face of the LOCOS film 5a from the upper surface of the semiconductor layer 3 is about 0.3 μm. Through an etching process, for example, performed after the heat oxidation, the upper portion of the LOCOS film 5a is etched to be thin, however, the depth of the lower face of the LOCOS film 5a from the upper surface of the semiconductor layer 3 does not change.

As shown in FIG. 5, in the case where the acceleration energy is about 200 keV as conventional, the on-resistance Ron is about 1020 Ω. On the other hand, in the case where the acceleration energy is 1000 keV, the on-resistance Ron is about 920 Ω. This means that the on-resistance of the N-channel transistor of this embodiment is reduced by about 10% from that of the conventional N-channel transistor. The source-to-drain breakdown voltage BVds is about 177 (v) when the acceleration energy is about 200 keV as conventional, while it is about 185 (v) when the acceleration energy is about 1000 keV. This means that the source-to-drain breakdown voltage of the N-channel transistor of this embodiment is increased by about 5%.

In other words, fabricating the N-channel transistor of this embodiment produces an N-channel transistor having a small on-resistance and a high source-to-drain breakdown voltage.

According to the simulation results shown in FIG. 5, when the acceleration energy in the process step shown in FIG. 2(c) is within a 500 to 2000 keV range, a preferable on-resistance Ron is obtained. In the case where the acceleration energy is 500 keV, the source-to-drain breakdown voltage BVds is 181 (V), and the difference from the maximum value (187 V) is small (about 5%). In the case where the acceleration energy is 500 keV, the peak of the phosphorus concentration is located at a depth of about 0.7 μm from the upper surface of the semiconductor layer 3. Since the depth of the lower face of the LOCOS film 5a from the upper surface of the semiconductor layer 3 is about 0.3 μm, the phosphorus concentration peak is located at a depth of about 0.4 μm from the lower face of the LOCOS film 5a. On the other hand, in the case where the acceleration energy is 2000 keV, the phosphorus concentration peak is located at a depth of about 1.8 μm from the upper surface of the semiconductor layer 3. Since the depth of the lower face of the LOCOS film 5a from the upper surface of the semiconductor layer 3 is about 0.3 μm, in this case the phosphorus concentration peak is located at a depth of about 1.5 μm from the lower face of the LOCOS film 5a. Specifically, to exhibit a small on-resistance, the above-described deep portion of the drain offset region 19 in the N-channel transistor, in which the impurity concentration peak exists, is preferably an extent of 0.4 through 1.5 μm in depth from the lower face of the LOCOS film 5a when the thickness of the semiconductor layer 3 beneath the LOCOS film 5a is 3.2 μm. Generally, the impurity-concentration peak, when defined by depth below the lower face of the LOCOS film 5a, is preferably in an extent of from 10% to 60% into the semiconductor-layer 3 thickness beneath the LOCOS film 5a.

Moreover, in accordance with the simulation results shown in FIG. 5, when the acceleration energy in the process step shown in FIG. 2(c) is within a 800 to 1500 keV range, a more preferable on-resistance Ron is obtained. In the case where the acceleration energy is 800 keV, the phosphorus concentration peak is located at a depth of about 0.9 μm from the upper surface of the semiconductor layer 3. Since the depth of the lower face of the LOCOS film 5a from the upper surface of the semiconductor layer 3 is about 0.3 μm, the phosphorus concentration peak is located at a depth of about 0.6 μm from the lower face of the LOCOS film 5a. On the other hand, in the case where the acceleration energy is 1500 keV, the phosphorus concentration peak is located at a depth of about 1.5 μm from the upper surface of the semiconductor layer 3. Since the depth of the lower face of the LOCOS film 5a from the upper surface of the semiconductor layer 3 is about 0.3 μm, in this case the phosphorus concentration peak is located at a depth of about 1.3 μm from the lower face of the LOCOS film 5a. Although the source-to-drain breakdown voltage BVds reaches a maximum value of 187 V when the acceleration energy is 1800 keV, the source-to-drain breakdown voltage BVds does not vary so much even when the acceleration energy is varied within the 800 to 1500 keV range. Thus, in principle, it is sufficient that only variations in the on-resistance be considered. Specifically, to exhibit a small on-resistance, the above-described deep portion of the drain offset region 19 in the N-channel transistor, in which the impurity concentration peak exists, is preferably an extent of 0.6 through 1.3 μm in depth from the lower face of the LOCOS film 5a when the thickness of the semiconductor layer 3 beneath the LOCOS film 5a is 3.2 μm. Generally, the impurity-concentration peak, when defined by depth below the lower face of the LOCOS film 5a, is preferably in an extent of from 20% to 40% into the semiconductor-layer 3 thickness beneath the LOCOS film 5a.

Further, the on-resistance of the N-channel transistor may be set equal to or less than a first established value (1000 Ω, for example) depending on the type or model of the semiconductor device, and in the fabrication process, ion-implantation conditions may be determined so that the on-resistance of the N-channel transistor is equal to or less than the first established value in the extent of the deep portion of the first drain offset region 19.

Moreover, after the phosphorus-ion implantation has been performed, a diffusion treatment, in which the SOI substrate is heated at a high temperature of from 1100 to 1200° C. for 120 to 180 minutes, is preferably performed: This allows the phosphorus to diffuse widely in the semiconductor layer 3, thereby enabling a small on-resistance and a high breakdown voltage to be obtained.

On the other hand, it is considered that variation in the source-to-drain breakdown-voltage characteristic occurs largely because the boron implanted in the process step shown in FIG. 2(b) counteracts the impurity in the body region 16. Specifically, it is considered that if the phosphorus concentration in the drain offset region 19 under the thin oxide silicon film 18 becomes low, spread of the depletion layer that occurs when a reverse voltage is applied is reduced to cause the source-to-drain breakdown voltage BVds to decrease. According to the data shown in FIG. 5, in order to maintain the breakdown voltage at a high level, it is preferable that the acceleration energy in the process step shown in FIG. 2(c) be within a 1000 to 2400 keV range. In the case where the acceleration energy is 1000 keV, the peak of the phosphorus concentration is located at a depth of about 1.1 μm from the upper surface of the semiconductor layer 3, while when the acceleration energy is 2400 keV, the peak of the phosphorus concentration is located at a depth of about 2.1 μm from the upper surface of the semiconductor layer 3. Accordingly, to keep the breakdown voltage at a high level, the above-described deep portion of the drain offset region 19 in the N-channel transistor, in which the peak of the impurity concentration exists, is preferably an extent of 0.8 through 1.8 μm in depth from the lower face of the LOCOS film 5a when the thickness of the semiconductor layer 3 beneath the LOCOS film 5a is 3.2 μm. Generally, the impurity-concentration peak, when defined by depth below the lower face of the LOCOS film 5a, is preferably in an extent of from 25% through 60% into the semiconductor-layer 3 thickness beneath the LOCOS film 5a.

Further, the source-to-drain breakdown voltage of the N-channel transistor may be set equal to or greater than a second established value (185 V, for example) depending on the type or model of the semiconductor device, and in the fabrication process, ion-implantation conditions may be determined so that the source-to-drain breakdown voltage of the N-channel transistor is equal to or greater than the second established value in the extent of the deep portion of the first drain offset region 19. In particular, it is possible to determine ion-implantation conditions in the fabrication process in such a manner that in the extent of the deep portion of the first drain offset region 19, the on-resistance of the N-channel transistor is equal to or less than the first established value and the source-to-drain breakdown voltage of the N-channel transistor is equal to or greater than the second established value.

Accordingly, by adjusting, e.g., the thickness of the LOCOS film 5a, that is, how deep the LOCOS film 5a goes into the semiconductor layer 3 from its surface (and the extent to which the upper surface of the LOCOS film 5a is etched), it is possible to select optimum ion-implantation conditions (particularly, acceleration energy) that allow the on-resistance to decrease and the source-to-drain breakdown voltage BVds to increase.

It should be noted that it is also possible to separately adjust the source-to-drain breakdown voltage by varying the dimension of the thin oxide silicon film 18 in the gate length direction, and the dose, acceleration energy and diffusion conditions for the boron ions implanted into the body region 16, for example.

Also, in the P-channel transistor in the semiconductor device of this embodiment, to keep the breakdown voltage at a high level, it is preferable that the acceleration energy at which the ions are implanted into the body region in the process step shown in FIG. 2(c) be within a 1000 to 2400 keV range. In the case where the acceleration energy is 1000 keV, the peak of the phosphorus concentration is located at a depth of about 1.1 μm from the upper surface of the semiconductor layer 3, while when the acceleration energy is 1400 keV, the peak of the phosphorus concentration is located at a depth of about 1.5 μm from the upper surface of the semiconductor layer 3. Accordingly, to keep the breakdown voltage at a high level, the above-described deep portion of the body region 26 in the P-channel transistor, in which the peak of the impurity concentration exists; is preferably an extent of 0.8 through 1.8 μm in depth from the lower face of the LOCOS film 5a when the thickness of the semiconductor layer 3 beneath the LOCOS film 5a is 3.2 μm. Generally, the impurity-concentration peak, when defined by depth below the lower face of the LOCOS film 5a, is preferably in an extent of from 25% through 60% into the semiconductor-layer 3 thickness beneath the LOCOS film 5a. Then, a high-concentration region in the P-type-impurity-containing drain offset region 29 is located near the surface, while the high-concentration region in the N-type-impurity-containing body region 26 is located in the deep portion of the semiconductor layer 3 in the thickness direction. This averts counteraction of the impurities that is due to these high-concentration regions being close to each other. And, the gradient of concentration (impurity-concentration variation per unit distance) in the region located from the body region 26 to the drain offset region 29 is allowed to be small, so that local electric filed concentration is avoided, thereby enabling the source-to-drain breakdown voltage to increase.

Moreover, the source-to-drain breakdown voltage of the P-channel transistor may be set equal to or greater than a third established value, depending on the type or model of the semiconductor device, and in the fabrication process, ion-implantation conditions may be determined so that the source-to-drain breakdown voltage of the P-channel transistor is equal to or greater than the third established value in the extent of the deep portion of the body region 26.

The semiconductor device of the present invention may be used as a high voltage semiconductor device for use in driving circuits in plasma displays.

Modified Example

Described in the embodiment is a case in which in fabricating a semiconductor device, ion-implantation processes for implanting impurity ions into the body regions 16 and 26 and the drain offset regions 19 and 29, and the subsequent annealing process for diffusing the impurities are performed under normal conditions. FIG. 1 illustrates the structure of the semiconductor device fabricated under those normal conditions. As shown in FIG. 1, the body regions 16 and 26 and the drain offset regions 19 and 29 reach the buried oxide film 2. However, depending on the fabrication conditions, it is possible to form a semiconductor device in which the body regions 16 and 26 and the drain offset regions 19 and 29 do not reach the buried oxide film 2, while substantially the same effects as those of the first embodiment are maintained.

Figure 7:
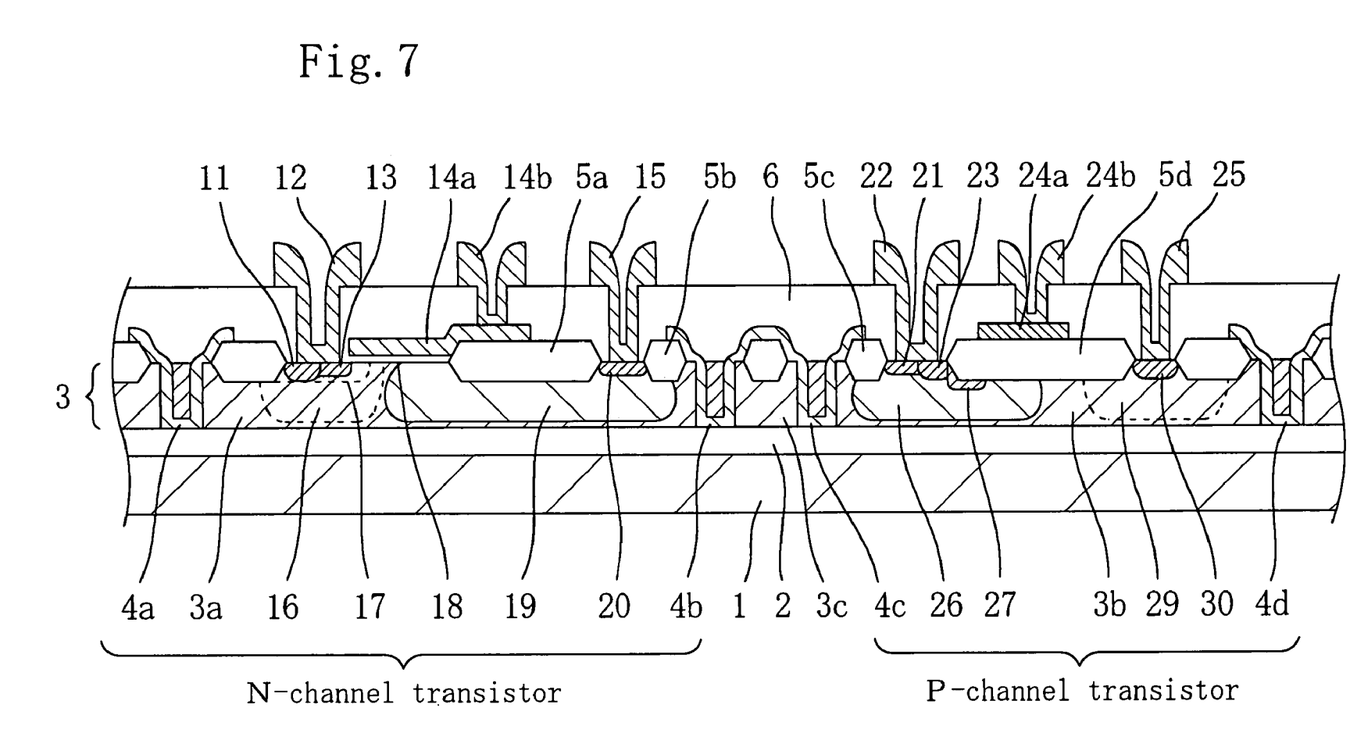
FIG. 7 is a cross-sectional view of a semiconductor device in accordance with a modified example of the embodiment of the present invention.

FIG. 7 is a cross-sectional view of a semiconductor device in accordance with a modified example of the embodiment of the present invention. In the modified example shown in FIG. 7, heating temperature and time employed in an annealing process for diffusing impurities that have been implanted into the body regions 16 and 26 and the drain offset regions 19 and 29, or the ion-implantation energies are set lower and shorter than the normal conditions. In this case, the body regions 16 and 26 and the drain offset regions 19 and 29 do not reach the buried oxide film 2, so that the bottoms of the regions 16, 19, 26, and 29 are spaced apart from the buried oxide film 2.

Further, even if the process conditions are the same as the normal conditions as in the embodiment, variation (such as variation in position on the wafer or variation among the lots) in the fabrication processes may result in a structure such as shown in FIG. 7.

What is claimed is:

1. A semiconductor device which includes a semiconductor layer provided on a buried insulating film on a substrate, and device-isolation regions dividing the semiconductor layer into a plurality of active regions, and in which a first transistor having a channel of a first conductivity type is provided in a first active region of the active regions, and a second transistor having a channel of a second conductivity type is provided in a second active region of the active regions,
   wherein the first transistor includes:
   a first source region of the first conductivity type, which is formed within the first active region;
   a first drain region of the first conductivity type, which is formed within the first active region so as to be spaced apart from the first source region;
   a first body region of the second conductivity type, which is formed within the first active region so as to be located adjacent to the first source region;
   a first gate insulting film, which is formed on the active region and has a thin film portion and a thick film portion, wherein the thin film portion is formed closer to the source by a gate oxidation process, and the thick film portion is formed closer to the drain by a LOCOS technique and connected to the thin film portion;
   a first drain offset region of the first conductivity type, which is formed adjacent to the first drain region within the first active region, and has an impurity-concentration peak in a deep portion located a certain depth-extent below the lower face of the thick film portion of the first gate insulating film; and
   a gate electrode, which extends over the thin film portion and a part of the thick film portion of the first gate insulating film.

2. The device of claim 1, wherein the deep portion of the first drain offset region is to an extent at which the on-resistance of the first transistor is equal to or less than a first established value.

3. The device of claim 1, wherein the deep portion of the first drain offset region is an extent of 10% through 60% into the thickness of the semiconductor layer beneath the thick film portion in depth from the lower face of the thick film portion.

4. The device of claim 1, wherein the deep portion of the first drain offset region is an extent of 20% through 40% into the thickness of the semiconductor layer beneath the thick film portion in depth from the lower face of the thick film portion.

5. The device of claim 1, wherein the deep portion of the first drain offset region is to an extent at which the source-to-drain breakdown voltage of the first transistor is equal to or greater than a second established value.

6. The device of claim 1, wherein the deep portion of the first drain offset region is an extent of 25% through 60% into the thickness of the semiconductor layer beneath the thick film portion in depth from the lower face of the thick film portion.

7. The device of claim 1, wherein the second transistor includes:
   a second source region of the second conductivity type, which is formed within the second active region;
   a second drain region of the second conductivity type, which is formed within the second active region so as to be spaced apart from the second source region;
   a second gate insulting film, which is formed by a LOCOS technique on a region of the active region which is located between the second source region and the second drain region;
   a second body region of the first conductivity type, which is formed within the second active region so as to be located adjacent to the second source region, and has an impurity-concentration peak in a deep portion located a certain depth-extent below the lower face of the second gate insulating film;
   a second drain offset region of the second conductivity type, which is formed adjacent to the second drain region within the second active region; and
   a gate electrode, which is formed on the second gate insulating film.

8. The device of claim 7, wherein the deep portion of the second body region is to an extent at which the source-to-drain breakdown voltage of the second transistor is equal to or greater than a third established value.

9. A semiconductor device which includes a semiconductor layer provided on a buried insulating film on a substrate, and device-isolation regions dividing the semiconductor layer into a plurality of active regions, and in which a first transistor having a channel of a first conductivity type is provided in a first active region of the active regions, and a second transistor having a channel of a second conductivity type is provided in a second active region of the active regions,
   wherein the second transistor includes:
   a second source region of the second conductivity type, which is formed within the second active region;
   a second drain region of the second conductivity type, which is formed within the second active region so as to be spaced apart from the second source region;
   a second gate insulting film, which is formed by a LOCOS technique on a region of the active region which is located between the second source region and the second drain region;
   a second body region of the first conductivity type, which is formed within the second active region so as to be located adjacent to the second source region, and has an impurity-concentration peak in a deep portion located a certain depth-extent below the lower face of the second gate insulating film;

a second drain offset region of the second conductivity type, which is formed adjacent to the second drain region within the second active region; and a gate electrode, which is formed on the second gate insulating film.

10. The device of claim 9, wherein the deep portion of the second body region is to an extent at which the source-to-drain breakdown voltage of the second transistor is equal to or greater than a third established value.

11. The device of claim 9, wherein the deep portion of the second body region is an extent of 25% through 60% into the thickness of the semiconductor layer beneath the second gate insulating film in depth from the lower face of the second gate insulating film.

* * * * *

UNITED STATES PATENT AND TRADEMARK OFFICE
CERTIFICATE OF CORRECTION

PATENT NO. : 6,975,003 B2
DATED : December 13, 2005
INVENTOR(S) : Osamu Matsui et al.

It is certified that error appears in the above-identified patent and that said Letters Patent is hereby corrected as shown below:

<u>Title page, Item [54] and Column 1, line 1,</u>
Title, change "SEMICONDUCTOR CMOS S0I" to -- SEMICONDUCTOR DEVICE AND METHOD FOR FABRICATING THE SAME --;

<u>Title page,</u>
Item [56], References Cited, insert the following:
-- FOREIGN PATENT DOCUMENTS
3111947        9/2000        (JP) --.

Signed and Sealed this

Twenty-third Day of May, 2006

JON W. DUDAS
*Director of the United States Patent and Trademark Office*